(12) United States Patent
Lau

(10) Patent No.: US 7,096,081 B2
(45) Date of Patent: Aug. 22, 2006

(54) METHOD OF IMPLEMENTING A VARIABLE NUMBER OF FILTER SECTIONS FOR DIGITAL SIGNAL PROCESSING

(75) Inventor: Kai Kwong Lau, Livonia, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 830 days.

(21) Appl. No.: 10/087,691

(22) Filed: Mar. 1, 2002

(65) Prior Publication Data

US 2003/0165245 A1   Sep. 4, 2003

(51) Int. Cl.
G06F 17/00 (2006.01)
H03G 5/00 (2006.01)

(52) U.S. Cl. .............. 700/94; 381/98; 381/103

(58) Field of Classification Search .............. 381/71.4, 381/98, 103; 700/94; 333/28 R; 708/322, 708/323
See application file for complete search history.

(56) References Cited

U.S. PATENT DOCUMENTS

| | | | |
|---|---|---|---|
| 4,453,255 A | 6/1984 | Tsuchikane et al. | |
| 5,195,141 A * | 3/1993 | Jang | 381/103 |
| 5,210,806 A | 5/1993 | Kihara et al. | |
| 5,434,923 A | 7/1995 | Honda | |
| 5,617,480 A | 4/1997 | Ballard et al. | |
| 5,754,874 A | 5/1998 | Watanabe et al. | |
| 5,983,087 A * | 11/1999 | Milne et al. | 455/149 |
| 6,405,227 B1 * | 6/2002 | Prakash | 708/300 |
| 6,704,421 B1 * | 3/2004 | Kitamura | 381/103 |
| 6,721,428 B1 * | 4/2004 | Allred et al. | 381/103 |
| 2002/0159607 A1 * | 10/2002 | Ford et al. | 381/103 |

FOREIGN PATENT DOCUMENTS

GB    2 377 535    8/2003

OTHER PUBLICATIONS

Gay-Bellile et al. "A reconfigurable superimposed 2D-mesh array for channel equalization", IEEE Int. Symp. Circuits & Systems 2002 (ISCAS 2002), May 26-29, 2002, vol. 1, pp. I-893 to I-896.

* cited by examiner

Primary Examiner—Sinh Tran
Assistant Examiner—Andrew Flanders
(74) Attorney, Agent, or Firm—Brinks, Hofer, Gilson & Lione

(57) ABSTRACT

A DSP-based equalization system which uses a jump and lookup table stored in volatile memory to execute a variable number of equalization structures stored in nonvolatile memory for the equalization of a data signal. The system and method of design provide minimal nonvolatile memory allocation.

6 Claims, 4 Drawing Sheets

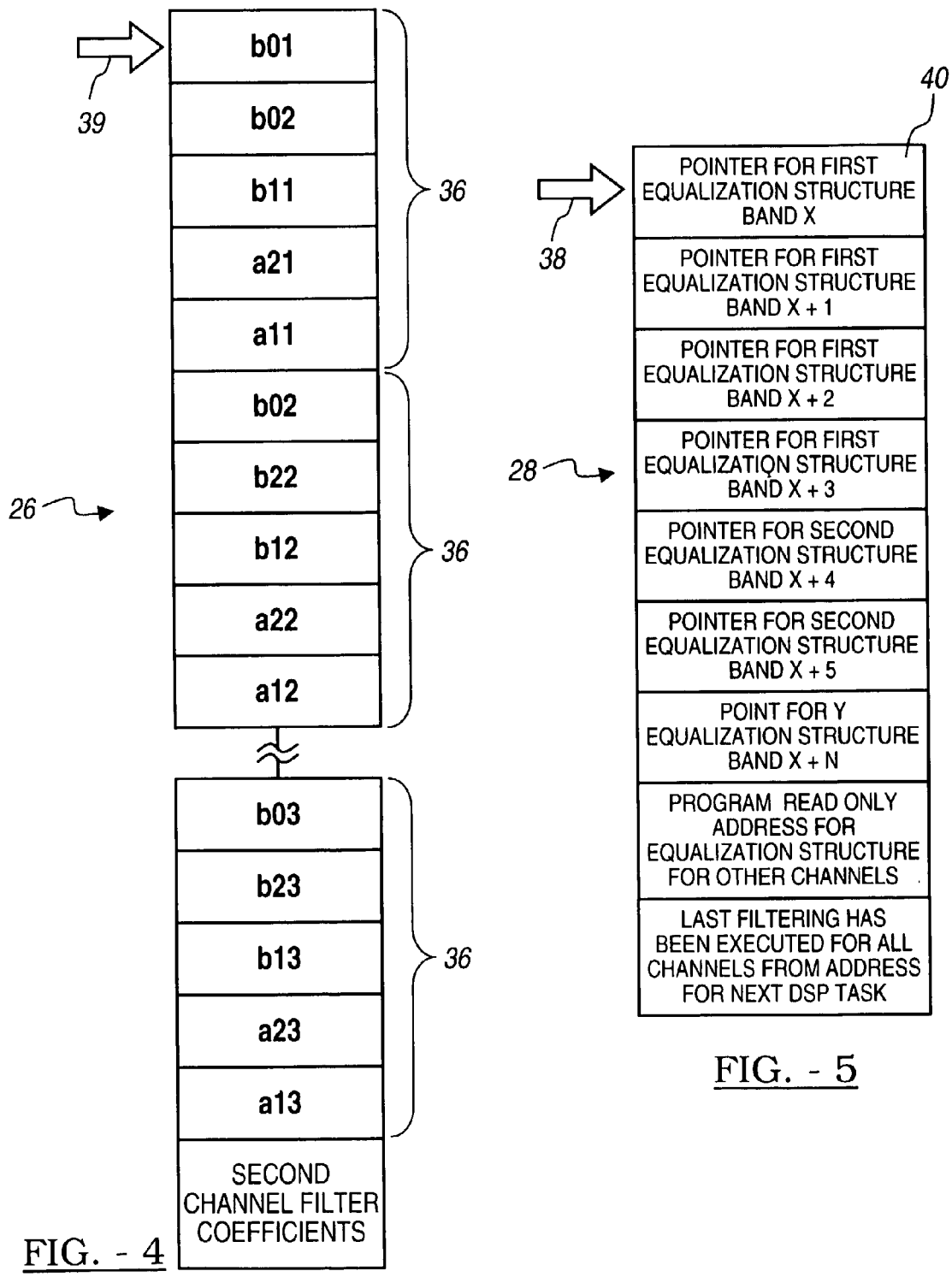

METHOD OF IMPLEMENTING A VARIABLE NUMBER OF FILTER SECTIONS FOR DIGITAL SIGNAL PROCESSING

TECHNICAL FIELD

This invention relates to a method for conditioning audio signals using filter sections in a digital signal processor.

BACKGROUND

Non-uniform environments surfaces such as an automotive vehicle interior have non-ideal acoustic responses. These degradations in the audio system can be overcome by using analog or digital filter sections in a digital signal processor (DSP) to equalize or shape audio signal content prior to being sent to the speakers. In a vehicle that has equalization, front and rear channels are equalized with a different number of filter sections for a given signal. For example, the DSP in the radio can be programmed and adjusted to equalize a vehicle for a desired acoustical sound. A programmer can determine which equalization characteristics are needed in a desired output for a given environment of a vehicle. Such equalization characteristics are programmed into the nonvolatile memory such as the ROM of the DSP for filtering.

The digital filter structures within the DSP manipulate discrete samples of an input signal to produce a filter signal output. During the processing of a signal, it may become necessary to change the filtering of the signal. To minimize hardware and/or software requirements, it may be desirable to use the same filter section or minimal filter sections with different digital filter coefficients. A programmer can write and execute code for the DSP utilizing more filter sections, but this is not practical since an end user is limited by the processor's bandwidth. The more filter structures the programmer uses the larger the memory will have to be to store the executable code. That is, a programmer would have to allocate additional memory every time the same or a different equalization structure is utilized.

To alleviate this issue, some DSP's have hardware registers for looping sections of code that can be changed even after the DSP has been masked into a ROM, although not all DSP's have this type of looping hardware.

What would be desirable to have is new and improved device and method for conditioning audio signals using a DSP overcoming the disadvantages described above. Such a device that uses volatile memory to initiate the executable code for a variable number of equalization filter sections would overcome such disadvantages.

SUMMARY

Consonant with an aspect of the present invention, the amount of memory used to equalize a given environment is reduced.

In one aspect of the invention, the method allows a variable number of filter sections to be dynamically allocated within the available DSP bandwidth where filtering is needed most. A jump and lookup table, which contains a variable number of addresses of executable code for filtering, is stored into a volatile memory such as RAM. Filter coefficients, which are used to create a specific filter structure to produce the desired audio output, are also stored into volatile memory. The jump and lookup table can execute a variable number of filter structures also known as equalization structures in conjunction with the filter coefficients for equalization of an input signal to obtain a desired output signal.

BRIEF DESCRIPTION OF THE DRAWINGS

A more complete appreciation of the present invention and many of its advantages will be readily obtained as they become better understood by reference to the following detailed description when considered in connection with the accompanying drawings and detailed specification.

FIG. 4 is a table showing a set of filter coefficients for a given equalization structure in accordance with the present invention;

FIG. 5 is a jump and lookup table showing addresses for executable code to be executed for an equalization structure in accordance with the present invention.

DETAILED DESCRIPTION OF THE INVENTION

Figure 1:
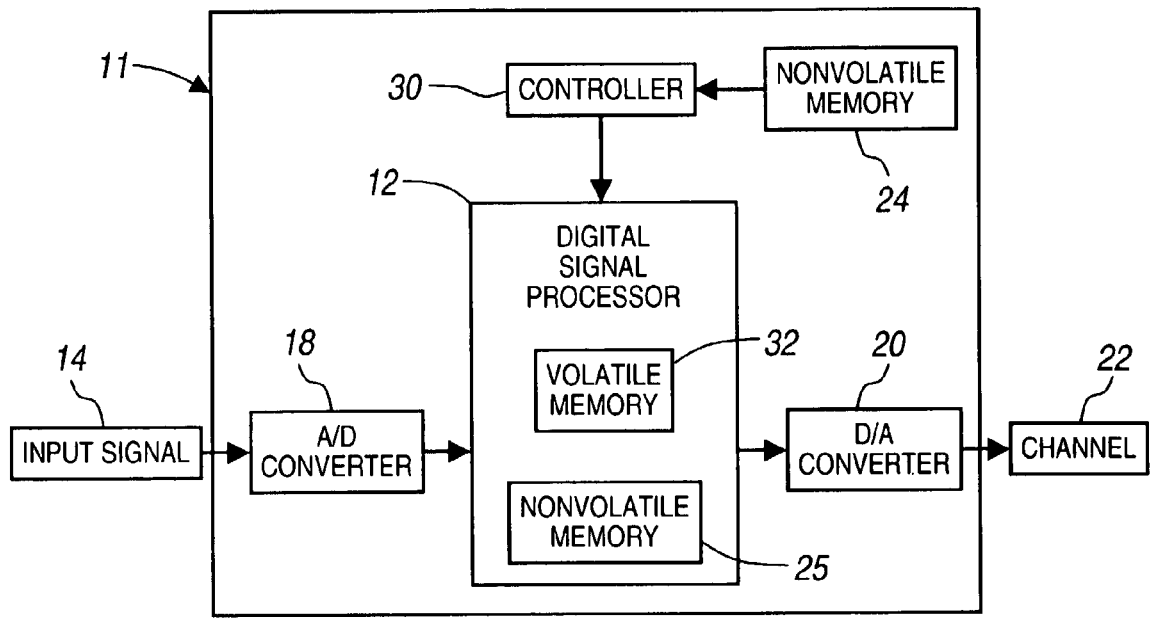
FIG. 1 is a block diagram showing portions of a DSP radio receiver, in accordance with the preset invention.

Referring to FIG. 1, a processing module 11 according to the present invention is shown. Processing module 11 includes a DSP 12 and a controller 30 for executing and processing an input signal 14. In a preferred embodiment the input signal 14 is that of an audio signal. An A/D converter 18 and a D/A converter 20 in communication with DSP 12 that are used to convert the input signal 14 from analog to digital and digital to analog are provided for input and output respectively. A nonvolatile memory 24 is also provided, such as an EEPROM, to initially store a jump and lookup table 28 and filter coefficients 26 which will be described in greater detail hereinafter. A volatile memory 32 in communication with DSP 12 is used to temporarily store data for filtering. Volatile memory 32 may be integrated into DSP 12 or be provided in a stand alone package. After processing has been executed and the D/A conversion has been completed input signal 14 is then distributed to various channels 22 such as stereo speakers.

Figure 2:
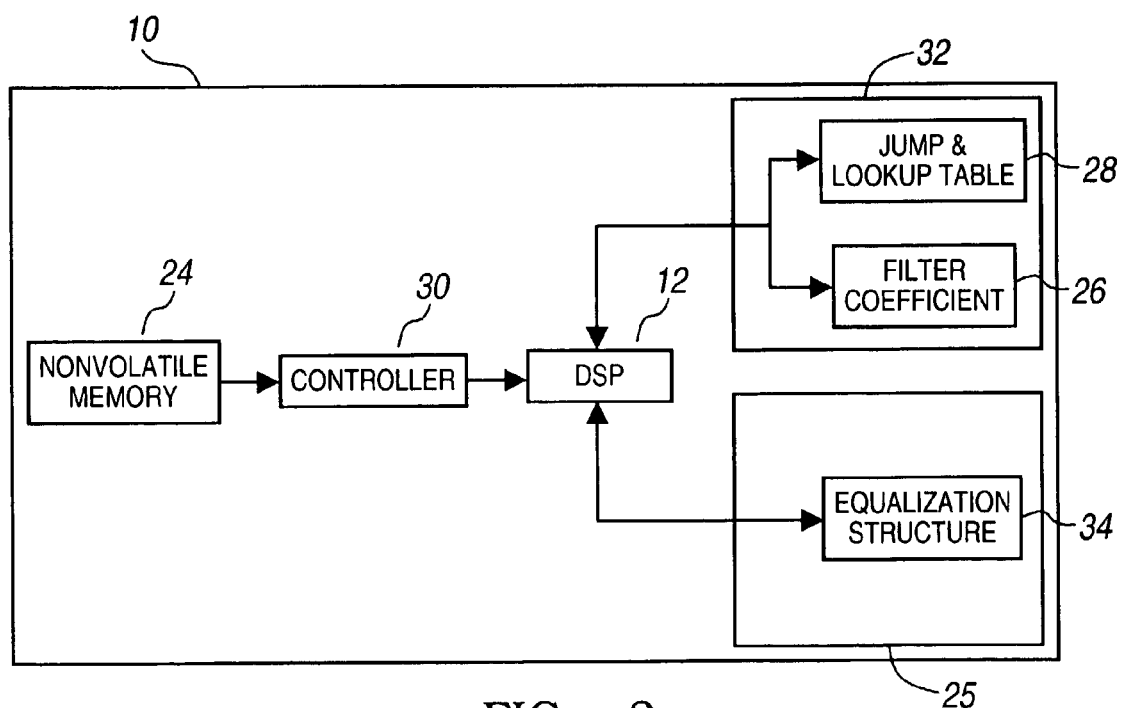
FIG. 2 is a block diagram showing elements to configure the input signal of a DSP in accordance with the present invention.

A block diagram of an equalization design system 10 which implements the executable code and filter characteristics is shown in FIG. 2. The nonvolatile memory 24 initially stores data containing filter coefficients 26 and jump and lookup table 28. The filter coefficients 26 and jump and lookup table 28 are created and programmed using a PC with desired filter characteristics created using a PC software Graphical User Interface, as disclosed in U.S. Pat. No. 5,617,480, prior to being stored in the nonvolatile memory 24. The filter coefficients 28 are settable so that an equalization structure 34 may be configured as desired. The controller 30 manages the communication between the nonvolatile memory 24 and the DSP 12. The controller 30 may be integrated into the DSP 12. Controller 30 is executed at the time the data stored in the nonvolatile memory 24 will be downloaded to the volatile memory 32 to begin processing the input signal 14. During the processing of the input signal 14, addresses in the jump and lookup table 28 contain locations that direct which equalization structure 34 will be utilized and the number of times the equalization structure 34 or an EQ band will be executed to filter the input signal 14.

Figure 3A:
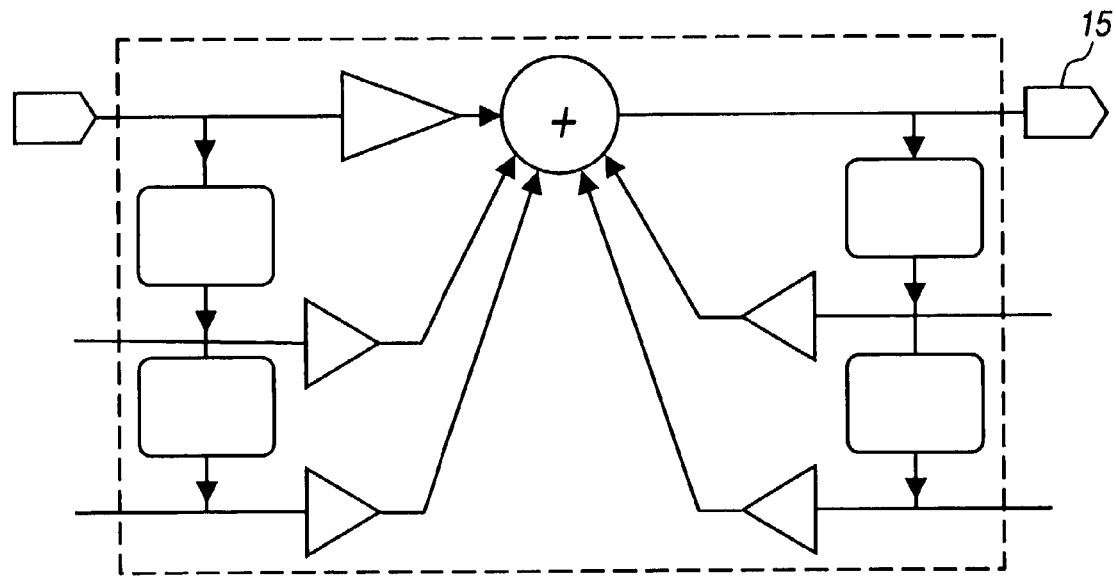
FIGS. 3a and 3b shows various equalization structures in accordance with the present invention.
Figure 3B:
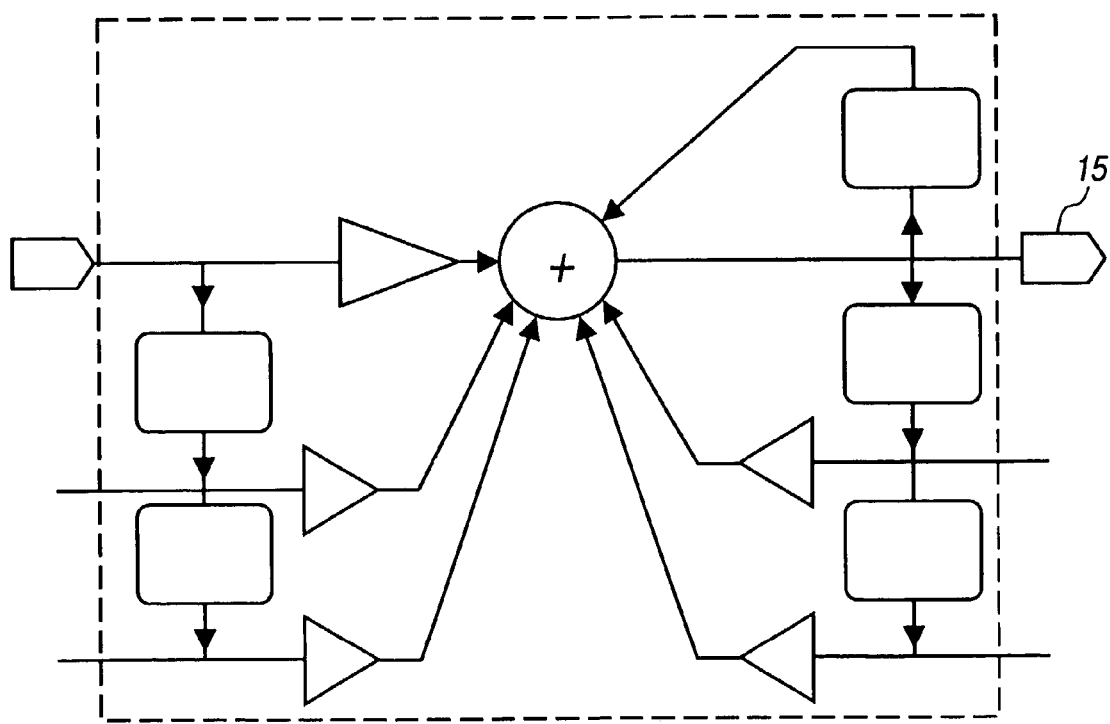

FIGS. 3*a* and 3*b* are schematic diagrams illustrating typical architecture for a second order equalization structure. In a first embodiment, a plurality of equalization structures are cascaded in series between an input and an output. The plurality of equalization structures may be of a same order or varying orders. An output of a predetermined first equalization structure known as an intermediate result 15 will become an input of a predetermined second equalization structure.

In another embodiment, an equalization structure may be used repeatedly for an entire bandwidth or for a certain number of bands. In this embodiment, an output of a predetermined first equalization structure will be stored in a data storage device (not shown) as an intermediate result 15 and reapplied to the predetermined first equalization structure for further processing until a desired output signal is achieved. The data storage device may be RAM, a register, an accumulator, or the like.

FIG. 4 shows a table containing filter coefficients 26 which are initially stored in the nonvolatile memory 24 for processing. The filter coefficients 26 are used to modify and shape the plurality of equalization structures. The filter coefficients 26 are segregated or grouped into sets of filter coefficients 36. A predetermined first set of filter coefficients will be executed with a predetermined first equalization structure to modify the input signal 14 (shown in FIG. 1) to obtain a desired intermediate result 15 (shown in FIGS. 3*a* and 3*b*). If the predetermined first equalization structure is re-utilized, then intermediate result 15 will be transmitted to the predetermined first equalization structure and a predetermined subsequent set of coefficients will be utilized to modify the predetermined first equalization structure. If a predetermined second equalization structure is utilized, then the intermediate result 15 will be transmitted to the predetermined second equalization structure utilizing the predetermined subsequent set of coefficients. Processing will continue with the subsequent set of coefficients using either the predetermined first equalization structure or a predetermined subsequent equalization structure until jump and lookup table 28 shows that a last equalization task has been executed and is redirected to a next task.

FIG. 5 shows a jump and lookup table 28 containing a list of addresses that direct DSP 12 to an appropriate executable code. The executable code is stored in a second nonvolatile memory 25 (shown in FIG. 1) of the DSP 12. The second nonvolatile memory 25 may reside on or off of the DSP 12. The executable code contains instructions as to which equalization structure 34 is to be executed and the number of times the predetermined first equalization structure or the predetermined subsequent equalization structures will be executed. Jump and lookup table 28 is downloaded from nonvolatile memory 24 into volatile memory 32. The controller 30 initiates the executable code in a first address 40 in the jump and lookup table 28 by use of a first pointer 38. A predetermined first address 40 contains a location of the executable code to run for initiating the processing of the predetermined first equalization structure. A second pointer 39 (shown in FIG. 4) is used to retrieve the predetermined first set of filter coefficients corresponding to the predetermined first equalization structure to be executed. After the executable code for the predetermined first address has been executed and processing is complete, first pointer 38 is incremented to a predetermined subsequent address of jump and lookup table 28. The predetermined subsequent address will contain a location of the executable code to execute either the predetermined first equalization structure or the predetermined subsequent equalization structure. Second pointer 39 will also be incremented to retrieve the predetermined subsequent set of coefficients. Incrementing first pointer 38 will continue until first pointer 38 indicates filtering is complete for a given channel. If other channels require filtering first pointer 38 and second pointer 39 will continue to increment, as previously described herein, until filtering has been completed for all channels.

Figure 6:
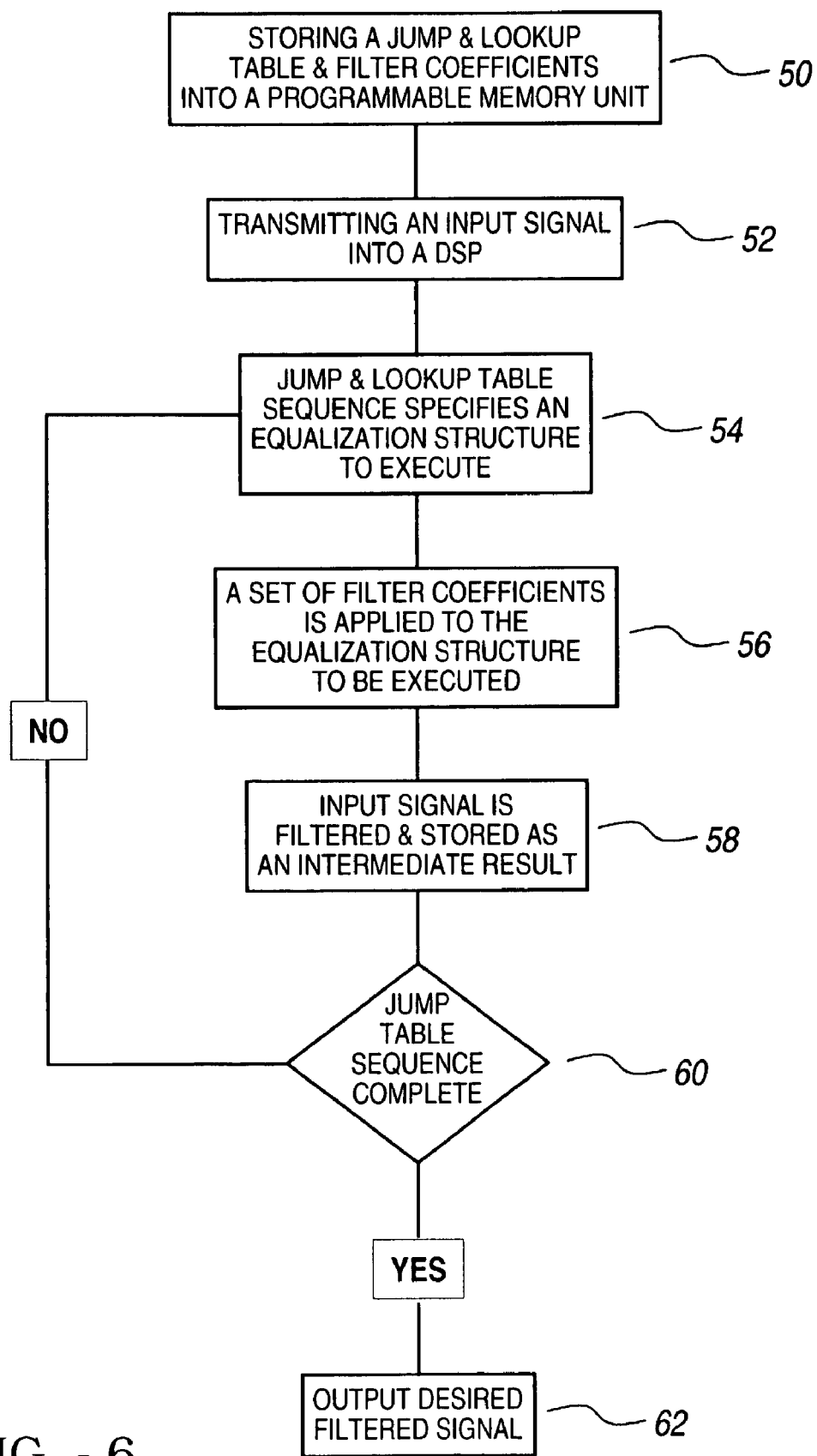
FIG. 6 is a flowchart showing a preferred method for modifying an equalization structure dynamically in accordance with the present invention.

The new and improved method of the present invention is shown in greater detail in FIG. 6. In step 50, filter coefficients and a jump and lookup table sequence are loaded and stored into a programmable memory unit such as a volatile memory device. The order of the filter coefficients and the jump and lookup table sequence are structured such that a pointer can be incremented so as to step through addresses of the jump and lookup table so as to run an executable code and apply a corresponding set of filter coefficients associated with an equalization structure to be executed. In step 52, an input signal is received by a DSP for filtering. In step 54, a pointer will be loaded with a first jump and lookup table entry which directs the DSP as to which equalization structure is to be executed. In step 56, a second pointer is loaded with an address of a set of coefficients to be transferred to the DSP for filtering the input signal. In step 58, the input signal is applied to a predetermined equalization structure and the output from said predetermined equalization structure is stored as intermediate result. In step 60, the pointer of said jump and lookup table is incremented to determine if the filtering is complete. If the filtering is not complete, then a return is made to step 54 for further filtering, otherwise the desired filtered signal is communicated to a respective channel as represented by step 62.

With the advantages described herein above, it is evident that by allocating the jump and lookup table 28 in volatile memory 32 containing addresses of the executable code to implement different equalization structures, less nonvolatile memory 25 will be utilized. Such efficiency is recognized wherein an equalization structure is stored only once in nonvolatile memory 25 and may be utilized as many times as needed without allocating additional addresses in nonvolatile memory 25 for subsequent uses.

Although the present invention has been described with regard to a vehicle audio system, the invention is not limited to such a system. The present invention may be used with equal utility in other embodiments and is not limited to those embodiments disclosed, and variations and modifications may be made without departing from the scope of the present invention.

I claim:

1. A method of equalizing an input signal for a digital signal processor (DSP) which produces an output signal having a desired frequency response, comprising the steps of:

transferring a jump and lookup table from nonvolatile memory to volatile memory, said jump and lookup table containing addresses to execute equalization structures of the DSP;

transferring a plurality of filter coefficients from said nonvolatile memory to said volatile memory, said plurality of filter coefficients provide optimum equalization structures to obtain said desired frequency response;

retrieving one of said addresses by use of a first pointer to execute a first equalization structure;

retrieving a corresponding set of filter coefficients by use of a second pointer to provide a first equalization structure;

producing an intermediate result in response to filtering said input signal;

incrementing said first pointer to next said addresses of said jump and lookup table to execute a subsequent equalization structure;

incrementing said second pointer to next said corresponding set of filter coefficients to provide a subsequent equalization structure;

transferring said intermediate signal to said subsequent equalization structure for additional filtering, incrementing said first pointer and said second pointer to provide next said subsequent equalization structure for additional filtering;

transferring said intermediate result as an equalized output signal when said first pointer indicates filtering is complete.

2. The method of claim 1 wherein said frequency response includes a set of separate frequency bands.

3. The method of claim 1 wherein said equalization structure uses a plurality of equalization structures.

4. The method of claim 3 wherein a first equalization structure has a first equalization characteristic and a second filter structure has a second filter characteristic.

5. The method of claim 1 wherein said equalization structure uses one equalization structure repeatedly.

6. The method of claim 1, wherein said input data signal is an audio signal and said jump and lookup table and said sets of filter coefficients are adapted to provide predetermined equalization according to a plurality of frequency bands customized to acoustical characteristics of a predetermined automobile interior.

* * * * *